United States Patent [19]

Petrov et al.

[11] 4,015,657

[45] Apr. 5, 1977

[54] DEVICE FOR MAKING SINGLE-CRYSTAL PRODUCTS

[76] Inventors: Dmitry Andreevich Petrov, ulitsa Chkalova, 21, kv. 80; Alexei Tikhonovich Tumanov, ulitsa Bolshaya Gruzinskaya, 36, kv. 58, both of Moscow, U.S.S.R.

[22] Filed: Sept. 3, 1975

[21] Appl. No.: 609,976

[52] U.S. Cl. .......................... 164/361; 23/273 SP; 156/616 R; 164/60
[51] Int. Cl.² .................. B22D 15/04; B01J 17/20
[58] Field of Search ................... 164/60, 348, 361; 23/273 SP; 156/616 R, 616 A, 617 SP

[56] References Cited

UNITED STATES PATENTS

| | | |
|---|---|---|
| 3,231,337 | 1/1966 | Barkemeyer et al. ....... 23/231 SP X |
| 3,538,981 | 11/1970 | Phipps, Jr. .................... 164/60 X |
| 3,591,340 | 7/1971 | Plaskett .................... 156/616 A |
| 3,759,310 | 9/1973 | Barrow et al. ................. 164/60 X |
| 3,857,436 | 12/1974 | Petrov et al. ................. 164/361 X |

*Primary Examiner*—Othell M. Simpson
*Assistant Examiner*—Horace M. Culver
*Attorney, Agent, or Firm*—Steinberg & Blake

[57] ABSTRACT

The device according to the invention is intended for making single-crystal products by the vertically-directed crystallization of molten metal on a seed and comprises a ceramic mould with a seed pocket in the bottom and a cooler with a flat face surface, installed under the mould and having an axial hole for accommodating the seed cooling unit interacting with the seed pocket and, according to the invention, installed with a provision for independent vertical movement relative to the cooler and seed pocket and made in the form of a tube embracing the seed pocket, said tube having an internal partition which divides the tube space into two compartments the lower of which is supplied with refrigerant and is made of a metal whose thermal conductivity ensures a maximum temperature gradient along the length of the seed for the initiation of a crystal.

The device will be used to advantage for making single-crystal ingots and products of metals and metal alloys with a preset crystallographic orientation such as, say, rotor blades of turbine engines and permanent magnets.

The device according to the invention ensures powerful cooling of the seed pocket with refrigerant, required for ensuring reliability and reproducibility of the process.

7 Claims, 1 Drawing Figure

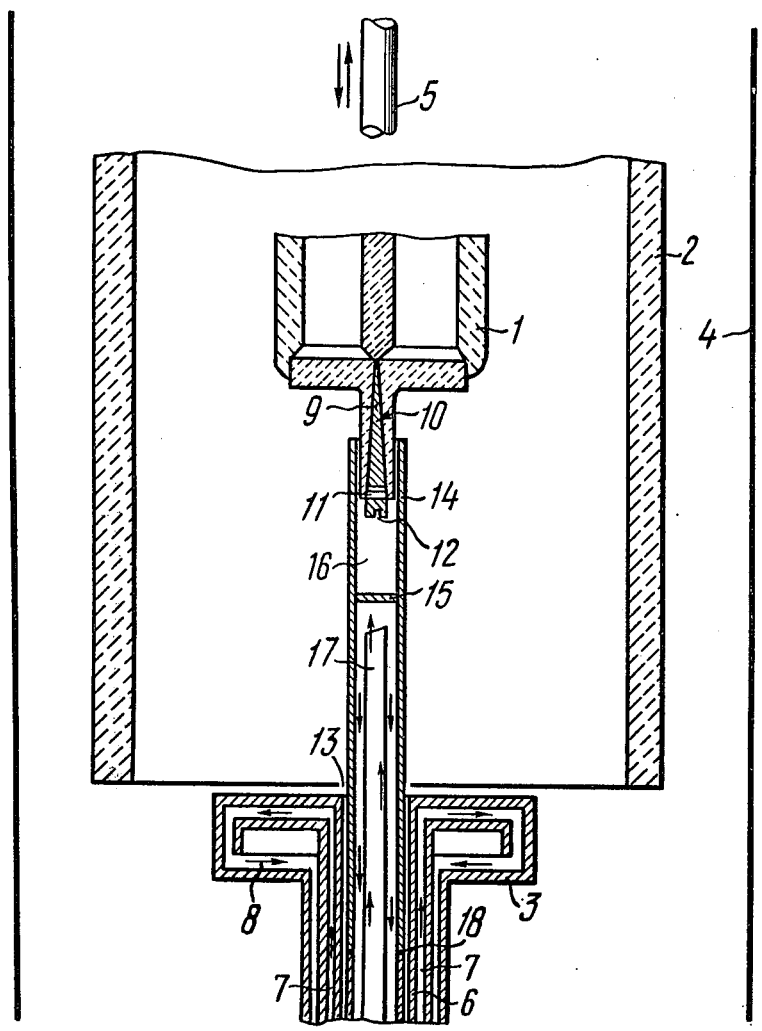

DEVICE FOR MAKING SINGLE-CRYSTAL PRODUCTS

The present invention relates to metallurgy and more particularly, to devices for making single-crystal products.

The invention will be beneficial for making single-crystal ingots and products from metals and metal alloys with a preset crystallographic orientation, e.g., rotor blades of turbine engines, permanent magnets, etc.

As distinct from ordinary polycrystalline products the single-crystal products are distinguished by the absence of boundaries between the crystals with different and random orientation which often constitute a weak point during operation of products, especially at elevated temperatures. Besides, inasmuch as the crystal is characterized by anistoropy which means that its properties, particularly mechanical and magnetic, depend on the direction in which they are measured in the crystal, the employment of single-crystal products makes it possible to utilize the optimum orientation of the crystal which imparts the highest characteristic to the product in operation. Investigations have proved that the service life of single-crystal blades in a turbine engine at the maximum working temperature is extended 4 times approximately, as compared with the polycrystalline blades, and 6–8 times at moderate temperatures while the power of single-crystal permanent magnets rises 2,5–3 times as compared to the magnets with the polycrystalline structure.

Known in the previous art is a device for making single-crystal products by the vertically-directed crystallization of the melt on a seed. This device comprises a ceramic mould with a pocket in the bottom for accommodating the seed, and a cooler installed under the mould with a provision for vertical motion, and having a flat face surface. The cooler has an axial hole to receive the seed cooling unit which interacts with the seed pocket and is rigidly connected with it.

The seed cooling unit of the known device is made in the form of, say, a copper cylinder moved in contact with the lower face of the seed; a sleeve slipped on the cylinder is capable of moving along said cylinder thus increasing or decreasing the total length of the unit.

The cooling unit is located in the hole of the cooler and, owing to the possibility of changing the length of the unit, it is possible to set the required distance between the mould bottom and the base of the cooler having a flat face surface. The cooling unit is intended to maintain the seed melting frontage at the required level which is attained by creating the required temperature gradient on the seed during heating of the mould and subsequent operations.

For making single-crystal products, e.g. turbine blades, from nickel-based heat-resistant alloys whose crystallization interval is rather wide (up to 150° C) the use of the known device with the cooling unit fails to ensure the sufficient temperature gradient on the seed and, consequently, the requisite reliability and reproducibility of the single-crystal growing process.

The value of said gradient must ensure a temperature of 1440° C on the upper hot end of the seed which contacts the molten metal poured into the mould, and ensure such temperature on the lower cold end which is at least 100° C lower than the initial melting point of the alloy to avoid probable melting of the seed in case of inadvertent overheating of the mould and penetration of the melt into the working chamber through the seed pocket.

From the standpoint of the length of the seed body during mould heating and of the molten metal supply into the mould, the device is divided into three zones, viz., upper zone of complete melting, lower completely solid zone, and intermediate or transitional liquid-solid zone.

The diameter of the seed whose purpose is to transfer its strictly oriented crystallographic structure to the crystal being grown should necessarily be minimal (1.5–2 mm) to suit the dimensions of the starting platform whose thickness at the crystal initiation point amounts to 0.6 mm.

With a view to protect the seed pocket against probable breakage, the seen must be as short as possible. Its actual length is 30–34 mm. This length must ensure a 300° C temperature drop on the seed so that the gradient on the seed is 300° C/34 mm, that is 100° C/cm approximately.

However, in practice the temperature drop on the seed in the known device cannot be higher than 10° C/cm, i.e., it is smaller by a whole order.

The known device having the naturally-cooled seed with its cooling unit in the hole of the cooler and working under vacuum (in absence of convection) is adapted for growing the single crystals of pure metals or low alloys only, with a narrow crystallization interval and is absolutely ineffective for growing the single crystals of complex alloys such as nickel-based heat-resistant alloys.

The main object of the invention is to provide a radically new device for making single-crystal products by the vertically-directed orientation of the melt on the seed which would ensure powerful cooling of the seed pocket with a refrigerant for the appropriate reliability and reproducibility of the process.

This and other objects are accomplished by providing a device for making single-crystal products by the vertically-directed crystallization of the molten metal on a seed, comprising a ceramic mould with a pocket in the bottom thereof for accommodating the seed, and a cooler installed under the mould with a provision for vertical motion, said cooler having a flat face surface and an axial hole to receive a seed cooling unit interacting with the seed pocket wherein, according to the invention, the cooling unit is installed with a provision for independent vertical movement relative to the cooler and seed pocket and is made in the form of a tube embracing the seed pocket and having an internal partition which divides the tube into compartments the lower of which is supplied with a refrigerant and is made of a metal whose thermal conductivity guarantees a maximum temperature gradient throughout the length of the seed.

The use of the device according to the invention ensures an axial temperature gradient on the seed up to 150°/cm. With such a gradient the intermediate zone on the seed determined by the value of the crystallization temperature interval of the alloy shrinks to 10 mm approximately at an interval of 150° C approximately of the heat-resistant alloys. This ensures powerful cooling of the seed pocket and, as a consequence, reliable initiation of the single crystal and a high yield of the faultless product (actually up to 100% with respect to the single-crystal structure).

By moving the cooling unit, made in the form of a tube with an internal partition, it is set either nearer to, or farther from, the mould bottom, so that it becomes easy to control the temperature on the upper end of the seed where it must be completely and freely melted before pouring the molten metal into the heated mould.

The employment of the tubular cooling unit in conjunction with the cooler having a flat face surface has ensured a high efficiency of the entire cooling system so that the elaborated procedure for growing single-crystal products from complex alloys, including single-crystal turbine blades, could be turned over for large-scale production.

It is most practicable if the cooling unit should be provided with a tube inserted coaxially into the tube which embraces the seed pocket and communicating with the system which supplies the refrigerant into the tube embracing the seed pocket.

The provision of the inner tube which is coaxial with the outer one makes it possible to ensure direct cooling of the partition which cools intensively the walls of the working portion of the pocket-embracing tube (i.e., the space of the tube above the partition).

The outer tube embracing the seed pocket should best be made of tungsten or molybdenum since among the high melting metals these metals are distinguished for high thermal conductivity.

For making single-crystal products from gold, copper, silver, aluminium, i.e., from metals with a melting point below 1100° C the best results will be obtained if the tube embracing the seed pocket is made of copper.

It is practicable that the tube embracing the seed pocket should consist of two interconnected portions of which the upper one embraces the seed pocket and is made of molybdenum or tungsten while the lower portion is made of stainless steel and the joint of the tube portions is located in the axial hole of the cooler.

Making the outer tube only partly of molybdenum or tungsten will give economy of these costly metals.

Now the invention will be described in detail by way of example with reference to the accompanying drawing which illustrates in longitudinal section a general view of the device according to the invention for making single-crystal products.

The device for making single-crystal products comprises a ceramic mould 1 surrounded by a graphite heating element 2. Located under the mould 1 is a cooler 3. The mould 1 together with the heating element 2 and cooler 3 is placed in a vacuum chamber 4 with water-cooled walls. A vertical rod 5 extending out of the upper cover (not shown in the drawing) of the chamber 4 can reciprocate relative to the chamber 4; the mould 1 is suspended from said vertical rod 5. The lower part of the chamber 4 accommodates the cooler 3 installed on a vertical movable rod 6. The cooler 3 has the form of a horizontal plate with a flat surface cooled with water supplied through a channel 7 in the rod 6 and communicating with a channel 8 in the plate of the cooler 3. The products with the desired crystallographic orientation are made with the aid of a seed 9 which is constituted by a seed crystal introduced into a seed pocket 10 located in the bottom of the ceramic mould 1. Placed into the seed pocket 10 under the seed 9 is a metal nut 11 used for fastening the lock 12 of the seed 9, said lock contacting with the lower face of the seed 9 and supporting the latter inside the seed pocket 10.

An axial hole 13 in the body of the cooler 3 accommodates the cooling unit of the seed 9, said unit interacting with the seed pocket 10.

According to the invention, the cooling unit is installed with a provision for independent vertical movement relative to the cooler 3 and seed pocket 10.

The cooling unit of the seed 9 has the form of a tube 14 embracing the seed pocket 10 and provided with an internal partition 15 which divides the space 16 of the tube 14 into the upper and lower compartments. The lower compartment is intended to receive the refrigerant.

The tube 14 and partition 15 are made of metal whose thermal conductivity creates a maximum temperature gradient along the length of the seed 9 for the initiation of a single crystal.

The refrigerant is fed into the lower compartment of the tube 14 through another tube 17 of the cooling unit, said tube 17 being installed coaxially inside the tube 14 embracing the seed pocket 10. The tube 14 consists of two interconnected parts of which the upper part embraces the seed pocket 10 and is made of molybdenum while the lower part is made of stainless steel. The joint 18 of these two parts is located in the axial hole 13 of the cooler 3 where the temperature does not rise above 20°–30° C.

The part of the tube 14 above the partition serves as the working portion of the cooling unit. In the course of heating the mould and growing the single crystal the working portion of the tube 14 embraces the lower part of the seed pocket 10 just enough to open the seed pocket 10 between the face of the working portion of the tube 14 and the bottom of the mould 1 for free heating by the heating element 2 and to keep it in this position constantly in the course of crystallization.

Depending on whether a larger or smaller temperature gradient is required on the seed pocket 10, the cooling unit is set nearer to, or farther from, the bottom of the mould 1.

The device functions as follows.

The mould 1 placed into a vacuum furnace is heated by the heating element 2 to a temperature which is higher than that of the beginning of melt crystallization.

Then metal melted in a separate furnace is poured into the mould 1. Immediately before this the temperature of the melt is checked by an expendable thermocouple.

During heating of the mould 1 the cooler 3 is set at such a distance from its bottom that its cooling effect on the mould 1 is practically nul.

After the metal has been poured into the mould 1, it is held within a time required for establishing correspondence between the temperature of the melt and mould 1.

For initiating the crystal, the cooler 3 is brought to the bottom of the mould 1 at a speed ensuring its contact with the mould 1 at the moment when the temperature of the melt on its bottom becomes slightly lower than the temperature of the beginning of crystallization.

Within the period when the cooler 3 gradually approaches the bottom of the mould 1, the melt is supercooled and thus a single nucleus of the crystal is initiated and propagated over the bottom of the mould 1 and upward. Immediately after the cooler 3 starts lifting, the melting frontage of the seed 9 moves upward inside the seed pocket 10. The melt on the bottom of the mould 1 starts crystallizing with the structure transmitted to the solidifying melt from the seed.

After the cooler 3 has contacted the mould 1, the latter goes down on the cooler 3 for continuing and completing the crystallization.

When the mould 1 moves down on the cooler, the cooling unit descends together with the latter.

We claim:

1. A device for making single-crystal products by vertically-directed crystallization of molten metal, comprising: a ceramic mould for the molten metal, said ceramic mould having a bottom formed with a pocket for accommodating a seed intended for the initiation of the crystal and making single-crystal products, said bottom of said mould including a wall and said pocket extending downwardly from said wall; a cooler formed with an axial hole, said cooler being situated under said mould with provision for vertical motion; a cooling unit for cooling a seed in said pocket, said cooling unit extending into said axial hole of said cooler, interacting with said seed pocket, installed with provision for independent vertical movement relative to said cooler and seed pocket, and including a tube having an upper end region surrounding and embracing said seed pocket; a partition in said tube, said partition being situated at an elevation lower than said seed pocket and dividing the space in said tube into an upper compartment into which said seed pocket extends and a lower compartment which is supplied with refrigerant; said tube being made of a metal whose thermal conductivity ensures a maximum temperature gradient along the length of a seed in said pocket for the initiation of a crystal.

2. A device according to claim 1 wherein the cooling unit is provided with another tube installed coaxially inside the tube embracing the seed pocket beneath said partition, said other tube communicating with a system which supplies refrigerant into said tube embracing the seed pocket.

3. A device according to claim 1 wherein the tube embracing the seed pocket is made of a metal selected from a group of metals consisting of tungsten and molybdenum.

4. A device according to claim 2 wherein the tube embracing the seed pocket is made of a metal selected from a group of metals consisting of tungsten and molybdenum.

5. A device according to claim 1 wherein the tube embracing the seed pocket is made of copper.

6. A device according to claim 2 wherein the tube embracing the seed pocket is made of copper.

7. A device according to claim 1 wherein the tube embracing the seed pocket consists of two interconnected portions the upper of which embraces the seed pocket and is made of a metal selected from a group of metals consisting of tungsten and molybdenum while the lower portion is made of stainless steel, the joint of these portions being located in the axial hole of the cooler.

* * * * *